United States Patent
Kuriyama

(10) Patent No.: US 7,952,953 B2
(45) Date of Patent: May 31, 2011

(54) SEMICONDUCTOR MEMORY DEVICE AND MEMORY SYSTEM INCLUDING THE SAME

(75) Inventor: Masao Kuriyama, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 253 days.

(21) Appl. No.: 12/335,961

(22) Filed: Dec. 16, 2008

(65) Prior Publication Data
US 2009/0180347 A1    Jul. 16, 2009

(30) Foreign Application Priority Data

Dec. 21, 2007  (JP) .................................. 2007-330560
Dec. 15, 2008  (KR) ......................... 10-2008-0127412

(51) Int. Cl.
*G11C 8/00*  (2006.01)
(52) U.S. Cl. ............... 365/230.06; 365/230.03; 365/206
(58) Field of Classification Search ............. 365/230.06, 365/230.03, 206
See application file for complete search history.

(56) References Cited

U.S. PATENT DOCUMENTS

| 6,717,871 | B2* | 4/2004 | Takase .......................... 365/200 |
| 6,894,943 | B2* | 5/2005 | Suzuki et al. ............. 365/230.03 |
| 2007/0127289 | A1* | 6/2007 | Lee ............................... 365/182 |

FOREIGN PATENT DOCUMENTS

JP   2002-008386   1/2002

* cited by examiner

*Primary Examiner* — Son T Dinh
(74) *Attorney, Agent, or Firm* — Volentine & Whitt, PLLC

(57) ABSTRACT

Provided is a semiconductor memory device. The semiconductor memory device includes: a first memory block including a first memory cell; a second memory block including a second memory cell; and a column decoder circuit accessing the first memory cell of the first memory block through a first conductor line and accessing the second memory cell of the second memory block through a second conductor line, wherein the column decoder circuit activates the first and second conductor lines in response to one of an address for reading the first memory cell and an address for reading the second memory cell.

8 Claims, 4 Drawing Sheets

SEMICONDUCTOR MEMORY DEVICE AND MEMORY SYSTEM INCLUDING THE SAME

CROSS-REFERENCE TO RELATED APPLICATIONS

This U.S. non-provisional patent application claims priority under 35 U.S.C. §119 of Japanese Patent Application No. 2007-330560 filed on Dec. 21, 2007 and Korea Patent Application No. 2008-127412 filed on Dec. 15, 2008, the entire contents of which are hereby incorporated by reference.

BACKGROUND OF THE INVENTION

The present invention disclosed herein relates to a connection between a selection bit line and a non-selection bit line of a non-volatile semiconductor memory array and a sense (or, detect) line and a reference sense line of a sense circuit. In more detail, the present invention relates to a semiconductor memory device includes a column decoder circuit. The column decoder circuit maintains a capacity balance to the maximum with respect to a sense line and a reference sense line and is mutually connected, without an increase of a column pre-decoder circuit.

As disclosed in the patent document 1 (Japanese Patent Publication No. 2002-8386), in a non-volatile semiconductor memory, one of a plurality of bit lines constituting a memory array is selectively connected to one of main bit lines, and one of a plurality of main bit lines is selectively connected to one of data lines. Additionally, a sense line of a differential amplifier constituting a sense circuit is connected to a data line and a reference sense line is connected to a reference data line in order to confirm data read from a memory cell.

In the differential amplifier constituting the sense circuit, in an aspect of tolerance with respect to a reading speed or noise, it is important to obtain capacity balance by accurately adjusting a capacity of the reference sense line to a capacity of a sense line. However, if a dummy capacity is used to adjust a capacity of the reference sense line to a capacity of the sense line, it is difficult to accurately adjust the capacity and also positions where a capacity is disposed are different. Therefore, it is vulnerable to noise and also a demerit occurs in terms of an area.

Therefore, according to the patent document 1, first and second column trees include a memory array having first and second memory cells and a line group to which data of the first and second memory cells are delivered. Additionally, once the first memory cell is selected, the first column tree is connected to a sense signal input terminal of the differential amplifier and the second column tree is connected to the reference signal input terminal in order to obtain a capacity balance. From now on, its structure will be described.

FIG. 2 is a memory block diagram illustrating a structure of a memory array acquiring a capacity balance between a sense line and a reference sense line of a differential amplifier. In FIG. 2, a first column tree is a line group to which data of the first memory cell are delivered and includes a first intermediate data line IDL01, a main bit line MBL0-01, and bit lines Bi:BL0, Bi:BL1, Bj:BL0, and Bj:BL1. A second column tree is a line group to which data of another memory cell are delivered and includes a second intermediate data line IDL23, a main bit line MBL0-23, and bit lines Bi:BL2, Bi:BL3, Bj:BL2, and Bj:BL3. A memory cell (not shown) is connected to the bit line BL to constitute the memory array.

Expansion of the memory array is completed by first column gates 0103-Bi:1 and 0103-Bj:1 (in a dashed line) having the above structure, in order to constitute blocks Bi and Bj, respectively. Therefore, since a second column gate 0105 is selected by a second column selection D1 of a second column selection decoder 0104, main bit lines MBL1-01 and MBL1-23 are connected to the first intermediate data lines IDL01 and IDL23, respectively.

Next, selection of the bit line BL will be described. a first column selection decoder 0102 decodes an inner address signal for column selection and selects one of a plurality of column selection signals Bi:H0 to Bi:H3 and Bj:H0 to Bj:H3 to activate it. Due to this, a gate of one of the first column gates 0103-Bi:0 and 0103-Bj:0 is turned on and one of the bit lines Bi:BL0 to Bi:BL3 and BJ:BL0 to Bj:BL3 is connected to one of the main bit lines MBL0-01 and MBL0-23. At this point, since the second column selection decoder 0104 is activated by a second column selection signal D0, the main bit line MBL0-01 is connected to the first intermediate data line IDL01 and the main bit line MBL0-23 is connected to the second intermediate data line IDL23.

A column shift selection decoder 0106 decodes an inner address signal for column selection and selects one of first column shift signals SW01 and SW23. When a memory cell in the first column tree is selected, the shift signal SW01 is set to be high and the shift signal SW23 is set to be low. Because of this, the first intermediate data line IDL01 is connected to the data line DL. Simultaneously, the second intermediate data line IDL23 is connected to the reference data line RDL. When a memory cell in the second column tree is selected, the shift signal SW01 is set to be low and the shift signal SW23 is set to be high. The second intermediate data line IDL23 is connected to the data line DL. Simultaneously, the first intermediate data line IDL01 is connected to the reference data line RDL.

Moreover, the data line DL is connected to the sense signal input terminal of the differential amplifier in the sense circuit, and the reference data line RDL is connected to a reference signal input terminal (not shown). Thus, one (including a memory cell selected to be read) of the first and second column trees is connected to the data line DL, and another tree is connected to the reference data line RDL. Because of this, structures of the first and second column trees are the same and their capacities are the same also. Accordingly, capacity added to the data line DL and the reference data line RDL may be the same and thus their capacities can be accurately adjusted.

However, according to this structure, in order to connect a selection bit line and a non-selection line of the first and second column trees to one of the main bit lines MBL0-01 and MBL0-23, each of the blocks Bi and Bj includes the same first column selection decoder 0102 separately. As a result, since the number of circuits in the first column selection decoder is increased by two times, area of a circuit layout becomes double. As a result, this increases a total chip size.

SUMMARY OF THE INVENTION

The present invention provides a semiconductor memory device including a column decoder circuit in a connection between a selection bit line and a non-selection bit line of a non-volatile semiconductor memory array and a sense (or, detect) line and a reference sense line of a sense circuit. The column decoder circuit maintains a capacity balance to the maximum with respect to a sense line and a reference sense line and is mutually connected, without an increase of a column pre-decoder circuit.

Embodiments of the present invention provide semiconductor memory devices including: a first memory block including a first memory cell; a second memory block including a second memory cell; and a column decoder circuit accessing the first memory cell of the first memory block through a first conductor line and accessing the second memory cell of the second memory block through a second conductor line, wherein the column decoder circuit activates the first and second conductor lines in response to one of an address for reading the first memory cell and an address for reading the second memory cell.

In some embodiments, the column decoder circuit comprises a first switch for activating the first conductor line; a second switch for activating the second conductor line; and a pre-decoder circuit for activating the first and second switches in response to one of the address for reading the first memory cell and the address for reading the second memory cell.

In other semiconductor memory devices further include a sense amplifier to determine data read from the first memory cell, wherein the column decoder circuit connects the first conductor line to a sense line of the sense amplifier and connects the second conductor line to the a reference sense line of the sense amplifier, the sense line being used for determining delivered read data, the reference sense line being used for providing a capacity balance with respect to the sense line.

In other embodiments, the column decoder circuit activates the first and second conductor lines in order to read the second memory cell.

In other embodiments of the present invention, memory systems include: the semiconductor memory device; and a controller controlling the semiconductor memory device.

In some embodiments, the semiconductor memory device and the controller are integrated into one semiconductor device.

In other embodiments, the semiconductor memory device and the controller constitute a semiconductor disk device.

In still other embodiments, the semiconductor memory device and the controller constitute a memory card.

In still other embodiments of the present invention, semiconductor memory devices include: a memory array including a first memory cell and a second memory cell, the first memory cell being disposed in a first direction of a plurality of first and second blocks, the second memory cell being disposed in a second direction thereof; a first column tree including a line group to which data of the first memory cell in the first direction of the first and second blocks are delivered; a second column tree including a line group to which data of the second memory cell in the second direction of the first and second blocks are delivered; and a column decoder circuit connecting a bit line of the first memory cell to a first main bit line of the first column tree and connecting a bit line of the second memory cell to a second main bit line of the second column tree. The column decoder circuit includes a first column gate circuit in the first block, a second column gate circuit in the second block, and a column pre-decoder circuit controlling the first and second column gate circuits. The first and second column gate circuit are disposed facing each other and are selected simultaneously by the column pre-decoder circuit. When the first memory cell is selected, a bit line of the selected first memory cell is connected to the first main bit line of the first column tree and a non-selection bit line of the second column tree is connected to the second main bit line of the second column tree at the same time. When the second memory cell is selected, a bit line of the selected second memory cell is connected to the second main bit line of the second column tree and a non-selection bit line of the first column tree is connected to the first main bit line of the first column tree at the same time.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A memory device according to an embodiment of the present invention includes a first memory block, a second memory block, and a column decoder circuit. The first memory block includes a first memory cell. The second memory block includes a second memory cell. The column decoder circuit accesses the first memory cell of the first memory block through a first conductor line and accesses the second memory cell of the second memory block through a second conductor line. The column decoder circuit activates the first and second conductor lines in response to an address for reading the first memory cell.

Figure 1:
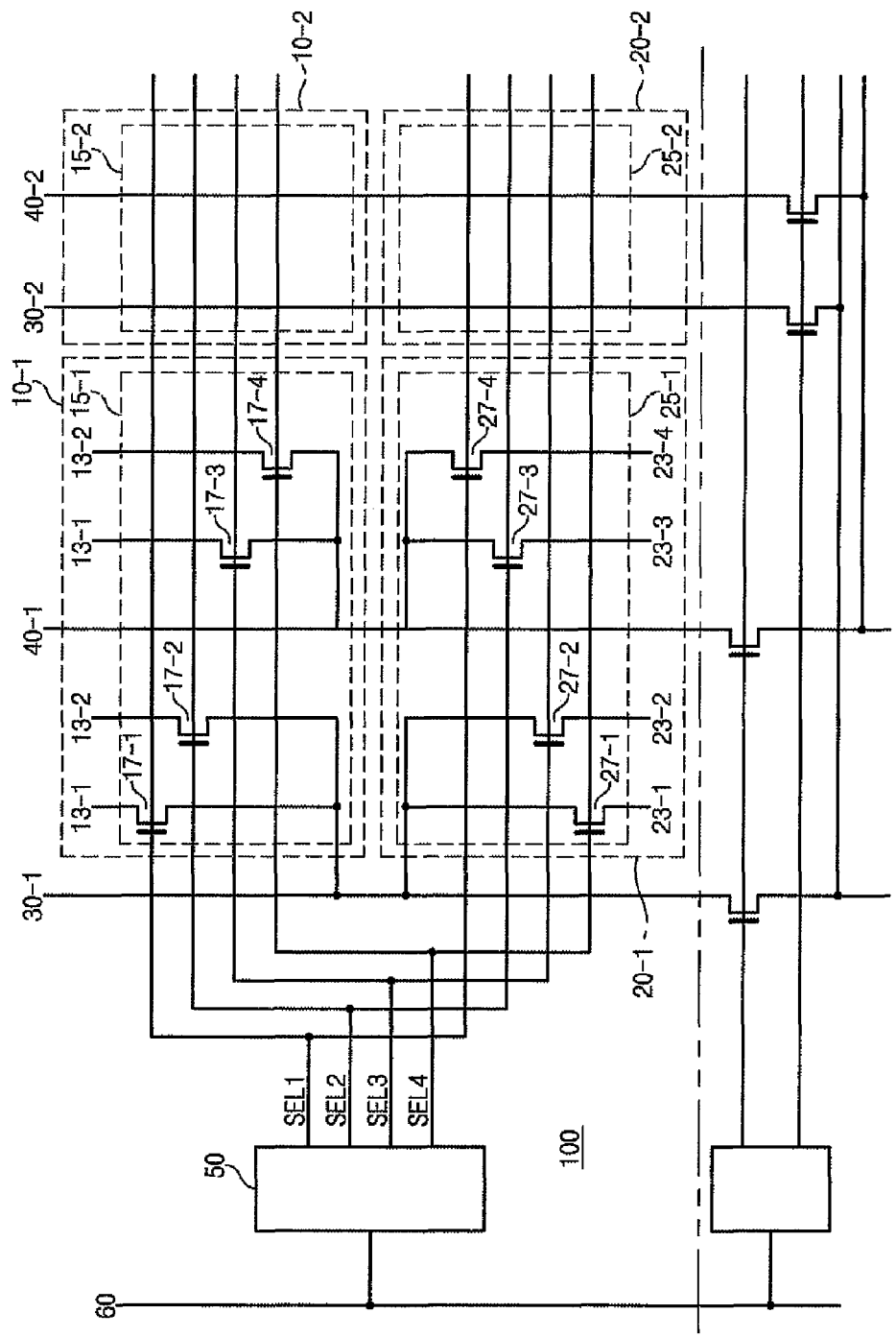
FIG. 1 is a block diagram illustrating a column decoder circuit according to an embodiment of the present invention.
Figure 2:
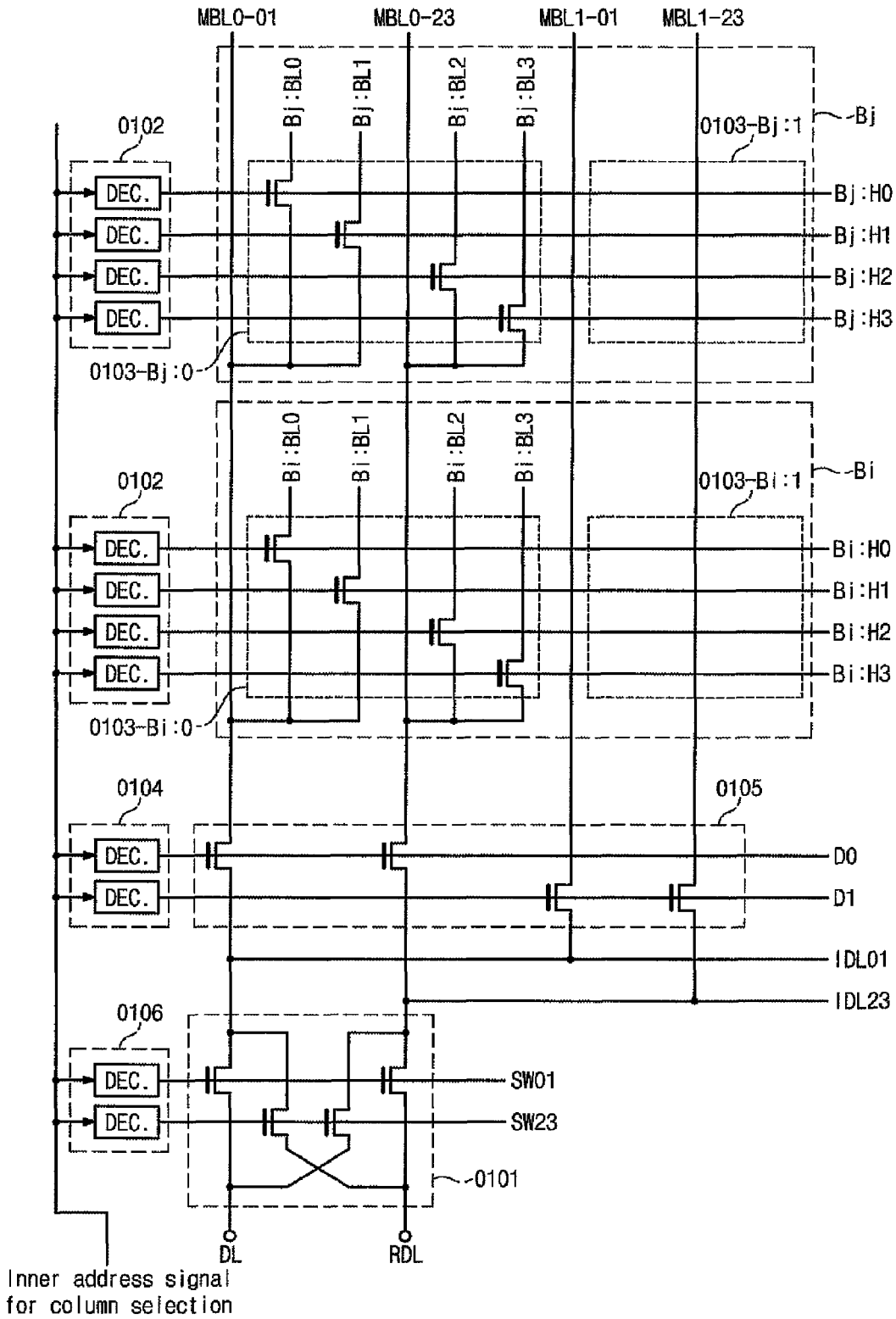
FIG. 2 is a memory block diagram illustrating a structure of a memory array acquiring a capacity balance between a sense line and a reference sense line of a differential amplifier.

FIG. 1 is a block diagram illustrating a column decoder circuit 100 according to an embodiment of the present invention. In FIG. 1, the column decoder circuit 100 includes a first column tree and a second column tree. The first column tree includes bit lines 13-1 and 13-2, bit lines 23-1 and 23-2, and a first main bit line 30-1 to which the first memory cell belongs, which is disposed at one direction of the first and second blocks 10-1 and 10-2. The second column tree includes bit line 13-3 and 13-4, bit lines 23-3 and 23-4, and a second main bit line 40-1 to which the second memory cell belongs, which is disposed at another direction of the first and second blocks 10-1 and 10-2.

Based on this tree structure, a first column gate circuit 15-1 is included in the first block 10-1 that connects one of the bit lines 13-1 and 13-2 of the first memory cell to one first main bit line 30-1 of the first column tree or connects one of the bit lines 13-3 and 13-4 of the second memory cell to one second main bit line 40-1 of the second column tree. A second column gate circuit 25-1 is included in the second block 20-1 that connects one of the bit lines 23-1 and 23-2 of the first memory cell to one first main bit line 30-1 of the first column tree or connects one of the bit lines 23-3 and 23-4 of the second memory cell to one second main bit line 40-1 of the second column tree. Provided is a column pre-decoder circuit 50 for controlling the first and second column gate circuits 15-1 and 25-1.

In the first column gate circuit 15-1 of the first block 10-1, sources of the NMOS transistors 17-1 and 17-2 are connected to the first main bit line 30-1 of the first column tree, its drains are connected to bit lines 13-1 and 13-2, respectively, and its gates are connected to the column pre-decoder circuit 50. Additionally, sources of the NMOS transistors 17-3 and 174 are connected to the second main bit line 40-1 of the second column tree, its drains are connected to bit lines 13-3 and 13-4, respectively, and its gates are connected to the column pre-decoder circuit 50. A plurality of the first memory cells are connected to the bit lines 13-1 and 13-2, respectively, and a plurality of the second memory cells are connected to the bit lines 13-3 and 13-4, respectively (not shown).

In the second column gate circuit 25-1 of the second block 20-1, sources of the NMOS transistors 27-1 and 27-2 are connected to the first main bit line 30-1 of the first column tree, its drains are connected to bit lines 23-1 and 23-2, respectively, and its gates are connected to the column pre-decoder circuit 50. Additionally, sources of the NMOS transistors 27-3 and 274 are connected to the second main bit line 40-1 of the second column tree, its drains are connected to bit lines 23-3 and 23-4, respectively, and its gates are connected to the column pre-decoder circuit 50. A plurality of the first memory cells are connected to the bit lines 23-1 and 23-2, respectively, and a plurality of the second memory cells are connected to the bit lines 23-3 and 23-4, respectively (not shown).

Once one of the first memory cells in the bit line 13-1 is selected, the column pre-decoder circuit 50 receives a selection address signal from a selection address signal line and outputs a select signal to a selection line SEL1. In response to this signal, NMOS transistors 17-1 and 27-1 are selected and a read signal of the first memory cell is delivered to the first main bit line 30-1 through the bit line 13-1 and the NMOS transistor 17-1. Also, the non-selection bit line 23-4 is connected to the second main bit line 40-1 through the NMOS transistor 274, as a load capacity. When one of the first memory cells in the bit line 13-2 is selected, a select signal is outputted to a selection line SEL2 through the same process. Additionally, the NMOS transistor 17-2 and 27-3 are selected and a read signal of the first memory cell is delivered to the first main bit line 30-1, and the non-selection bit line 23-3 is connected to the second main bit line 40-1, as a load capacity.

Once one of the second memory cells in the bit line 13-3 is selected, the column pre-decoder circuit 50 receives a selection address signal from a selection address signal line and outputs a select signal to the selection line SEL3. In response to this signal, NMOS transistors 17-3 and 27-2 are selected and a read signal of the second memory cell is delivered to the second main bit line 40-1 through the bit line 13-3 and the NMOS transistor 17-3. Also, the non-selection bit line 23-2 is connected to the first main bit line 30-1 through the NMOS transistor 27-2, as a load capacity. When one of the second memory cells in the bit line 13-4 is selected, a select signal is outputted to a selection line SEL4 through the same process. Additionally, the NMOS transistor 17-4 and 27-1 are selected and a read signal of the first memory cell is delivered to the second main bit line 40-1. Also, the non-selection bit line 23-1 is connected to the first main bit line 30-1, as a load capacity.

When one of the first memory cells of the bit line 23-1 is selected, the NMOS transistors 27-1 and 17-4 are selected. When one of the first memory cells of the bit line 23-2 is selected, the NMOS transistors 27-2 and 17-3 are selected. When one of the second memory cells in the bit line 23-3 is selected, the NMOS transistors 27-3 and 17-2 are selected. When one of the second memory cells in the bit line 23-4 is selected, the NMOS transistors 27-4 and 17-1 are selected. A read signal of the selected memory cell is delivered and a load capacity of the non-selection bit line is connected. Additionally, the first main bit line 30-1 and the second main bit line 40-1 are connected to a sense line of the sense amplifier through the column selection decoder and the column shift gate to deliver a read signal of the memory cell, and are connected to the reference sense line to apply a load capacity of the non-selection bit line.

In expansion of the memory array, the first block 10-2 having the first column gate circuit 15-2 and the second block 20-2 having the second column gate circuit 25-2 become a pair, such that expansion is completed. In this case, while selecting each tree, the first main bit lines 30-1 and 30-2 and the second main bit lines 40-1 and 40-2, where a selection bit line and a non-selection bit line are combined, are selected by the column selection decoder through the same process. Through the column shift gate, a read signal of the selection bit line is delivered to a sense line of the sense amplifier, and a load capacity of the non-selection bit line is connected like being connected to the reference sense line.

As mentioned above, according to the embodiments of the present invention, the first and second column gate circuits are disposed to face each other, and are simultaneously selected by the column pre-decoder circuit. Accordingly, it is possible to provide a connection between a selection bit line and a non-selection bit line of a non-volatile semiconductor memory array and a sense (or, detect) line and a reference sense line of a sense circuit, without expansion of the column pre-decoder circuit. Also, it is possible to maintain a capacity balance with respect to a sense line and a reference sense line to the maximum. By applying the column decode circuit, the chip size does not need to be increased and a semiconductor memory device having an excellent capacity balance with respect to the sense line and the reference sense line can be provided.

Figure 3:
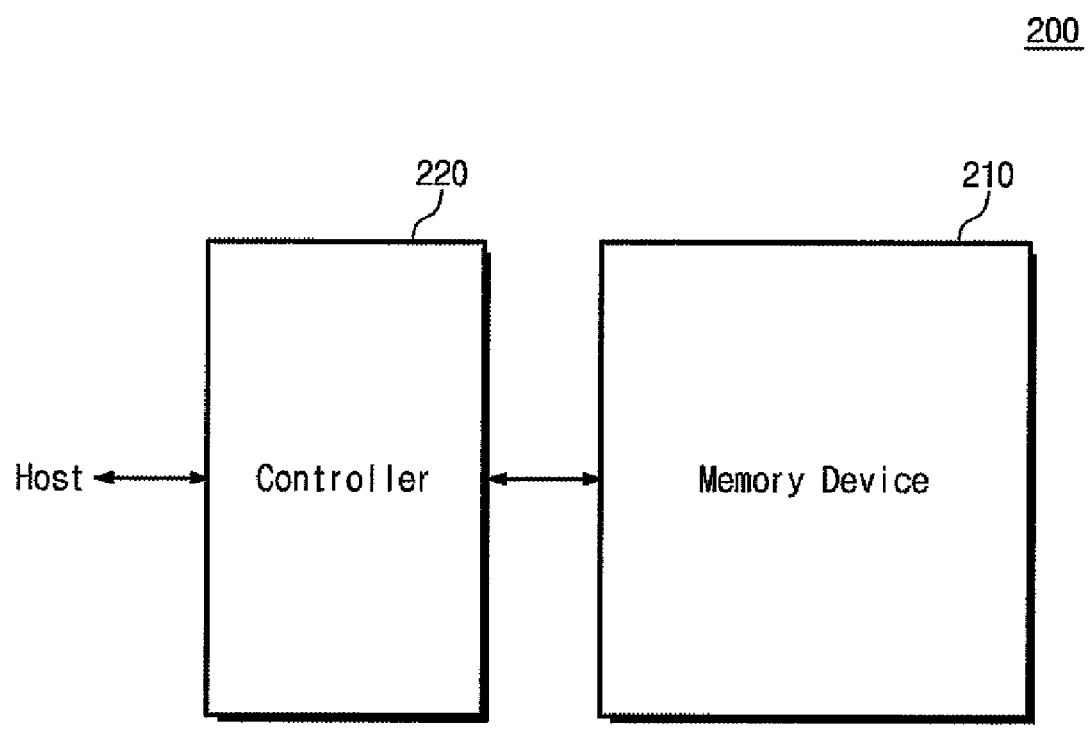
FIG. 3 is a block diagram illustrating a memory system including a semiconductor memory device with a column decoder circuit.

FIG. 3 is a block diagram illustrating a memory system 200 including a semiconductor memory device 210 with a column decoder circuit 100. Referring to FIG. 3, the memory system 200 includes a semiconductor memory device 210 and a controller 220.

The controller 220 is connected to a host and the semiconductor memory device 210. The controller 220 delivers data read from the semiconductor memory device 210 into the host, and stores data delivered from the host in the semiconductor memory device 210.

The controller 220 includes well-known components such as RAM, a processing unit, a host interface, and a memory interface. The RAM is used as an operating memory of the processing unit. The processing unit controls general operations of the controller 220. The host interface may include a protocol for data exchange between the host and the controller 220. For example, the controller 220 is configured to communicate with an external (e.g., a host) via one of various interface protocols such as a universal series bus (USB), a multi-media card (MMC), peripheral component interface (PCI)-E, advanced technology attachment (ATA), serial-ATA, parallel-ATA, a small computer system interface (SCSI), an enhanced small disk interface (ESDI), and integrated drive electronics (IDE). The memory interface interfaces with the semiconductor memory device 210. The controller 220 may additionally include an error correction block. The error correction block detects and corrects an error of data read from the semiconductor memory device 210.

The semiconductor memory device 210 includes a memory cell array for storing data, a read/write circuit for writing and reading data into and from the memory cell array, an address decoder for decoding an address from the outside to deliver the decoded address to the read/write circuit, and a control logic for controlling general operations of the semiconductor memory device 210. The memory cell array of the semiconductor memory device 210 will be formed with the structure illustrated in FIG. 1. For example, the semiconductor memory device 210 includes non-volatile memory devices such as SRAM, DRAM, SDRAM, etc. In another example, the semiconductor memory device 210 includes a non-volatile memory device such as ROM, PROM, EPROM, EEPROM, a flash memory device, PRAM, MRAM, RRAM, FRAM, etc.

The controller 220 and the semiconductor memory device 210 may be integrated into one semiconductor device. For example, the controller 220 and the semiconductor memory device 210 are integrated into one semiconductor device to constitute a memory card. For example, the controller 220 and the semiconductor memory device 210 are integrated into one semiconductor device to constitute a memory card such as a PC card (PCMCIA), a compact flash card (CF), a smart media card (SM/SMC), a memory stick, a multimedia card (MMC, RS-MMC, and MMCmicro), a SD card (SD, miniSD, and microSD), and a universal flash memory device (UFS).

In another example, the controller 220 and the semiconductor memory device 210 may be integrated into one semiconductor device to constitute a solid state disk/drive (SSD). If the memory system 200 is used as the SSD, an operating speed of the host connected to the memory system 200 will be drastically increased.

In another example, the memory system 200 may be applied to a personal digital assistant (PDA), a portable computer, a web tablet, a wireless phone, a mobile phone, a digital music player, or devices transmitting and receiving information via a wireless environment.

In another embodiment, the semiconductor memory device 210 and/or the memory system 200 according to the present invention may be packaged using various types of packages. Examples of the packages include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), tin small outline (TSOP), thin quad flatpack (TQFP), system in package (SIP), multi chip package (MCP), wafer-level fabricated package (WFP), wafer-level processed stack package (WSP), etc.

Figure 4:
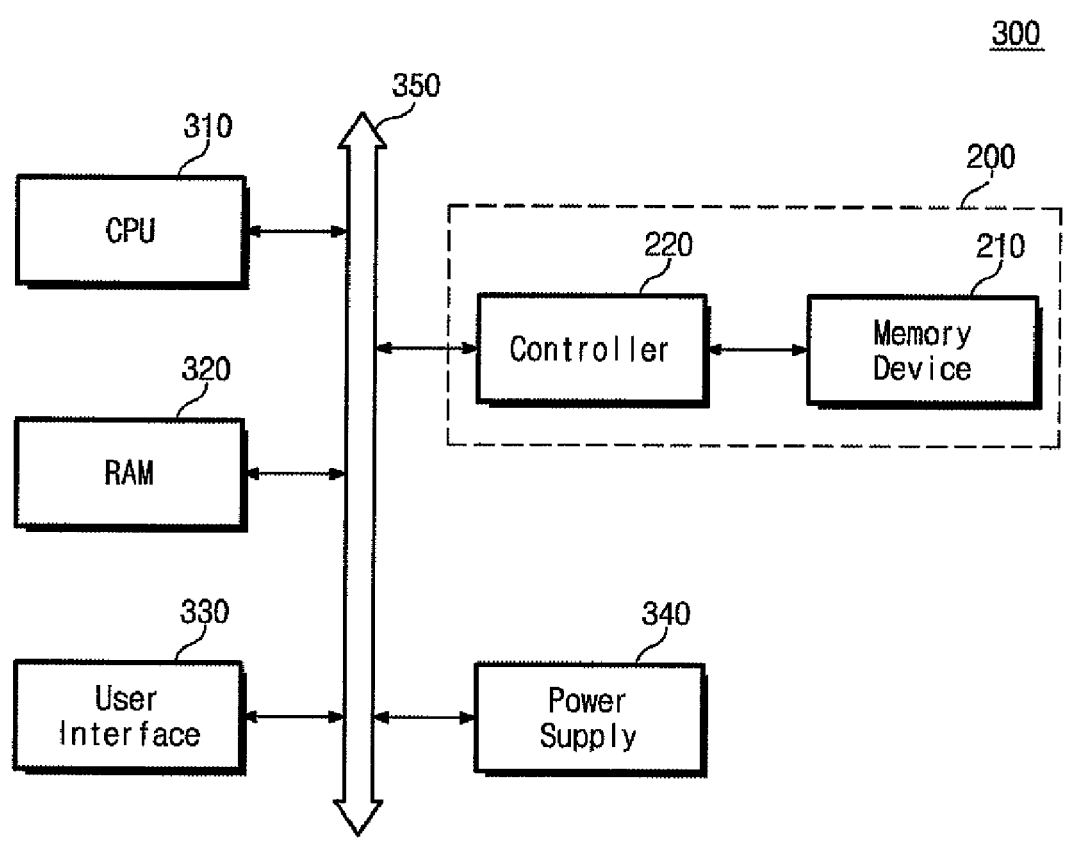
FIG. 4 is a block diagram illustrating a computing system with the memory system of FIG. 4.

FIG. 4 is a block diagram illustrating a computing system 300 with the memory system 200 of FIG. 4. Referring to FIG. 4, the computing system 300 includes a central processing unit (CPU) 310, a RAM 320, a user interface 330, a power 340, and the memory system 200.

The memory system 200 is electrically connected to the CPU 310, the RAM 320, the user interface 330, and the power 340 through a system bus. Data provided through the user interface 330 or processed by the CPU 310 are stored in the memory system 200. The memory system 200 includes the controller 220 and the semiconductor memory device 210.

If the memory system 200 is mounted as the SSD, a booting speed of the computing system 300 will be drastically increased. Although not illustrated in FIG. 4, it is apparent to those skilled in the art that an application chipset, a camera image processor (CIS), a mobile DRAM may be further provided to the computing system 300 according to the present invention.

According to the present invention, a semiconductor memory device includes a column decoder circuit in a connection between a selection bit line and a non-selection bit line of a non-volatile semiconductor memory array and a sense (or, detect) line and a reference sense line of a sense circuit. The column decoder circuit maintains a capacity balance to the maximum with respect to a sense line and a reference sense line and is mutually connected, without an increase of a column pre-decoder circuit.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
a first memory block including a first memory cell;
a second memory block including a second memory cell;
a column decoder circuit accessing the first memory cell of the first memory block through a first conductor line and accessing the second memory cell of the second memory block through a second conductor line; and
a sense amplifier determining data read from the first memory cell,
wherein the column decoder circuit activates the first and second conductor lines in response to one of an address for reading the first memory cell and an address for reading the second memory cell, and
wherein the column decoder circuit connects the first conductor line to a sense line of the sense amplifier and connects the second conductor line to a reference sense line of the sense amplifier, the sense line for determining delivered read data, the reference sense line for providing a capacity balance with respect to the sense line.

2. The semiconductor memory device of claim 1, wherein the column decoder circuit comprises
a first switch for activating the first conductor line;
a second switch for activating the second conductor line; and
a pre-decoder circuit for activating the first and second switches in response to one of the address for reading the first memory cell and the address for reading the second memory cell.

3. The semiconductor memory device of claim 1, wherein the column decoder circuit activates the first and second conductor lines in order to read the second memory cell.

4. A memory system comprising:
the semiconductor memory device of claim 1; and
a controller controlling the semiconductor memory device.

5. The memory system of claim 4, wherein the semiconductor memory device and the controller are integrated into one semiconductor device.

6. The memory system of claim 4, wherein the semiconductor memory device and the controller constitute a semiconductor disk device.

7. The memory system of claim 4, wherein the semiconductor memory device and the controller constitute a memory card.

8. A semiconductor memory device comprising:
a memory array including a first memory cell and a second memory cell, the first memory cell being disposed in a first direction of a plurality of first and second blocks, the second memory cell being disposed in a second direction thereof;

a first column tree including a line group to which data of the first memory cell in the first direction of the first and second blocks are delivered;

a second column tree including a line group to which data of the second memory cell in the second direction of the first and second blocks are delivered; and a column decoder circuit connecting a bit line of the first memory cell to a first main bit line of the first column tree and connecting a bit line of the second memory cell to a second main bit line of the second column tree, wherein:

the column decoder circuit includes a first column gate circuit in the first block, a second column gate circuit in the second block, and a column pre-decoder circuit controlling the first and second column gate circuits;

the first and second column gate circuit are disposed facing each other and are selected simultaneously by the column pre-decoder circuit;

when the first memory cell is selected, a bit line of the selected first memory cell is connected to the first main bit line of the first column tree and a non-selection bit line of the second column tree is connected to the second main bit line of the second column tree at the same time; and when the second memory cell is selected, a bit line of the selected second memory cell is connected to the second main bit line of the second column tree and a non-selection bit line of the first column tree is connected to the first main bit line of the first column tree at the same time.

* * * * *